(12) United States Patent
Altice

(10) Patent No.: US 12,143,736 B2
(45) Date of Patent: *Nov. 12, 2024

(54) METHOD, APPARATUS AND SYSTEM PROVIDING A STORAGE GATE PIXEL WITH HIGH DYNAMIC RANGE

(71) Applicant: Lodestar Licensing Group LLC, Evanston, IL (US)

(72) Inventor: Parker Altice, Meridian, ID (US)

( * ) Notice: Subject to any disclaimer, the term of this patent is extended or adjusted under 35 U.S.C. 154(b) by 187 days.

This patent is subject to a terminal disclaimer.

(21) Appl. No.: 17/858,894

(22) Filed: Jul. 6, 2022

(65) Prior Publication Data

US 2023/0025262 A1    Jan. 26, 2023

Related U.S. Application Data

(63) Continuation of application No. 17/322,480, filed on May 17, 2021, now Pat. No. 11,582,411, which is a continuation of application No. 16/715,662, filed on Dec. 16, 2019, now Pat. No. 11,044,426, which is a continuation of application No. 15/861,442, filed on Jan. 3, 2018, now Pat. No. 10,523,881, which is a continuation of application No. 15/231,287, filed on Aug. 8, 2016, now Pat. No. 9,900,528, which is a continuation of application No. 14/089,225, filed on Nov. 25, 2013, now Pat. No. 9,412,779, which is a
(Continued)

(51) Int. Cl.
| | | |
|---|---|---|
| H04N 25/59 | (2023.01) | |
| H01L 27/146 | (2006.01) | |
| H04N 25/571 | (2023.01) | |
| H04N 25/589 | (2023.01) | |
| H04N 25/621 | (2023.01) | |
| H04N 25/75 | (2023.01) | |
| H04N 25/76 | (2023.01) | |
| H04N 25/771 | (2023.01) | |

(52) U.S. Cl.
CPC ....... *H04N 25/59* (2023.01); *H01L 27/14643* (2013.01); *H01L 27/14656* (2013.01); *H04N 25/575* (2023.01); *H04N 25/589* (2023.01); *H04N 25/622* (2023.01); *H04N 25/75* (2023.01); *H04N 25/76* (2023.01); *H04N 25/771* (2023.01)

(58) Field of Classification Search
CPC ........ H04N 3/155; H04N 3/156; H04N 5/335; H04N 5/355; H04N 5/35527; H04N 5/35581; H04N 5/3559; H04N 5/3592; H04N 5/374; H04N 5/37452; H04N 5/378; H04N 25/575; H04N 25/589; H04N 25/59; H04N 25/622; H04N 25/75; H04N 25/76; H04N 25/771; H01L 27/14643; H01L 27/14656
See application file for complete search history.

(56) References Cited

U.S. PATENT DOCUMENTS 5,955,753 A    9/1999    Takahashi
6,107,655 A    8/2000    Guidash
(Continued)

*Primary Examiner* — Lin Ye
*Assistant Examiner* — Chriss S Yoder, III

(57) ABSTRACT

A method, apparatus and system are described providing a high dynamic range pixel. An integration period has multiple sub-integration periods during which charges are accumulated in a photosensor and repeatedly transferred to a storage node, where the charges are accumulated for later transfer to another storage node for output.

30 Claims, 7 Drawing Sheets

Related U.S. Application Data continuation of application No. 13/216,664, filed on Aug. 24, 2011, now Pat. No. 8,599,293, which is a continuation of application No. 11/511,310, filed on Aug. 29, 2006, now Pat. No. 8,026,966.

(56) References Cited

U.S. PATENT DOCUMENTS

| | | |
|---|---|---|
| 6,160,281 A | 12/2000 | Guidash |
| 6,218,656 B1 | 4/2001 | Guidash |
| 6,352,869 B1 | 3/2002 | Guidash |
| 6,423,994 B1 | 7/2002 | Guidash |
| 6,552,323 B2 | 4/2003 | Guidash et al. |
| 6,657,665 B1 | 12/2003 | Guidash |
| 6,778,212 B1 | 8/2004 | Deng et al. |
| 6,927,793 B1 | 8/2005 | Seitz et al. |
| 6,947,088 B2 | 9/2005 | Kochi |
| 7,242,429 B1 | 7/2007 | Lee et al. |
| 7,332,786 B2 | 2/2008 | Altice et al. |
| 7,443,437 B2 | 10/2008 | Altice et al. |
| 7,465,602 B2 | 12/2008 | Altice et al. |
| 8,026,966 B2 | 9/2011 | Altice |
| 8,599,293 B2 | 12/2013 | Altice |
| 9,412,779 B2 | 8/2016 | Altice |
| 9,900,528 B2 | 2/2018 | Altice |
| 10,523,881 B2 | 12/2019 | Altice |
| 2005/0110093 A1 | 5/2005 | Altice et al. |
| 2005/0110884 A1* | 5/2005 | Altice, Jr. ............ H04N 25/65 348/E3.018 |
| 2005/0231619 A1 | 10/2005 | Nakamura et al. |
| 2006/0266922 A1* | 11/2006 | McGrath ........... H01L 27/14623 257/E27.132 |
| 2006/0266925 A1 | 11/2006 | Hopper et al. |
| 2008/0055441 A1 | 3/2008 | Altice et al. |
| 2009/0073293 A1 | 3/2009 | Yaffe et al. |
| 2011/0303827 A1 | 12/2011 | Altice et al. |
| 2014/0077071 A1 | 3/2014 | Altice et al. |
| 2017/0134676 A1 | 5/2017 | Altice et al. |
| 2018/0146146 A1 | 5/2018 | Altice |
| 2020/0120295 A1 | 4/2020 | Altice |

* cited by examiner

METHOD, APPARATUS AND SYSTEM PROVIDING A STORAGE GATE PIXEL WITH HIGH DYNAMIC RANGE

CROSS-REFERENCE TO RELATED APPLICATIONS

This application is a continuation of U.S. application Ser. No. 17/322,480, filed May 17, 2021, which is a continuation of U.S. application Ser. No. 16/715,662, filed Dec. 16, 2019, now U.S. Pat. No. 11,044,426, which is a continuation of U.S. application Ser. No. 15/861,442, filed Jan. 3, 2018, now U.S. Pat. No. 10,523,881; which is a continuation of U.S. application Ser. No. 15/231,287, filed Aug. 8, 2016, now U.S. Pat. No. 9,900,528; which is a continuation of U.S. application Ser. No. 14/089,225, filed Nov. 25, 2013, now U.S. Pat. No. 9,412,779; which is a continuation of U.S. application Ser. No. 13/216,664, filed Aug. 24, 2011, now U.S. Pat. No. 8,599,293; which is a continuation of U.S. application Ser. No. 11/511,310, now U.S. Pat. No. 8,026,966; each of which is incorporated herein by reference in their entirety.

TECHNICAL FIELD

The invention relates generally to imager devices, and more particularly to a pixel having increased dynamic range.

BACKGROUND

An imager, for example, a complementary metal oxide semiconductor (CMOS) imager, includes a focal plane array of pixels; each cell includes a photo-conversion device, for example, a photogate, photoconductor or a photodiode overlying a substrate for producing a photo-generated charge in a doped region of the substrate. A readout circuit is provided for each pixel and includes at least a source follower transistor and a row select transistor for coupling the source follower transistor to a column output line. The pixel also typically has a floating diffusion node, connected to the gate of the source follower transistor. Charge generated by the photo-conversion device is sent to the floating diffusion node. The imager may also include a transistor for transferring charge from the photo-conversion device to the floating diffusion node and another transistor for resetting the floating diffusion node to a predetermined charge level prior to charge transference.

FIG. 1 illustrates a block diagram of a CMOS imager device 208 having a pixel array 200 with each pixel being constructed as described above. Pixel array 200 comprises a plurality of pixels arranged in a predetermined number of columns and rows. The pixels of each row in array 200 are all turned on at the same time by a row select line, and the pixels of each column are selectively output by respective column select lines. A plurality of row and column lines are provided for the entire array 200. The row lines are selectively activated in sequence by the row driver 210 in response to row address decoder 220 and the column select lines are selectively activated in sequence for each row activated by the column driver 260 in response to column address decoder 270. Thus, a row and column address is provided for each pixel. The CMOS imager 208 is operated by the control circuit 250, which controls address decoders 220, 270 for selecting the appropriate row and column lines for pixel readout, and row and column driver circuitry 210, 260, which apply driving voltage to the drive transistors of the selected row and column lines. The pixel output signals typically include a pixel reset signal, Vrst, taken off the floating diffusion node when it is reset and a pixel image signal, Vsig, which is taken off the floating diffusion node after charges generated by an image are transferred to it. The Vrst and Vsig signals are read by a sample and hold circuit 265 and are subtracted by a differential amplifier 267 that produces a signal Vrst-Vsig for each pixel, which represents the amount of light impinging on the pixels. This difference signal is digitized by an analog to digital converter 275. The digitized pixel signals are then fed to an image processor 280 to form a digital image. The digitizing and image processing can be performed on or off the chip containing the pixel array.

Image sensors, such as an image sensor employing the conventional pixels described above, as well as sensors employing other pixel architectures, have a characteristic light dynamic range. Light dynamic range refers to the range of incident light that can be accommodated by an image sensor in a single frame of pixel data. It is desirable to have an image sensor with a high light dynamic range to image scenes that generate high light dynamic range incident signals, such as indoor rooms with windows to the outside, outdoor scenes with mixed shadows and bright sunshine, night-time scenes combining artificial lighting and shadows, and many others.

Image sensors also have a characteristic electrical dynamic range, commonly defined as the ratio of its largest non-saturating signal to the standard deviation of the noise under dark conditions. The electrical dynamic range is limited on an upper end by the charge saturation level of the sensor and on a lower end by noise imposed limitations and/or quantization limits of the analog to digital converter used to produce the digital image. When the light dynamic range of an image sensor is too small to accommodate the variations in light intensities of the imaged scene, e.g., by having a low light saturation level, the full range of the image scene is not reproduced. The illumination-voltage profile of the conventional pixel is typically linear, as shown in FIG. 2, which illustrates an illumination v. output voltage graph of a prior art pixel. A pixel's maximum voltage Vout-max may be reached at a relatively low level of illumination $I_{max-1}$ which causes the pixel to be easily saturated, thus limiting the dynamic range of the pixel.

When the incident light captured and converted into a charge by the photosensor during an integration period is greater than the capacity of the photosensor, excess charge may overflow and be transferred to adjacent pixels. This undesirable phenomenon is known as blooming, or charge cross talk, and results in a bright spot in the output image. Furthermore, the output of each cell in an array of image pixels may vary even under uniform illumination due to inherent variations in the physical makeup of each pixel, such as slight differences in threshold voltages of transistors. These differences cause additional defects in the output image referred to as fixed pattern noise.

Imager pixels, including CMOS imager pixels, typically have low signal-to-noise ratios and narrow dynamic range because of their inability to fully collect, transfer, and store the full extent of electric charge generated by the photosensitive area of the photo-conversion device. Since the amplitude of the electrical signals generated by any given pixel in a CMOS imager is very small, it is especially important for the signal-to-noise ratio and dynamic range of the pixel to be as high as possible. Generally speaking, these desired features are not attainable without additional devices that increase the size of the pixel. Therefore, there is a need for an improved pixel for use in an imager that provides high signal to noise ratio and high dynamic range while maintaining a small pixel size.

DETAILED DESCRIPTION

Figure 1:
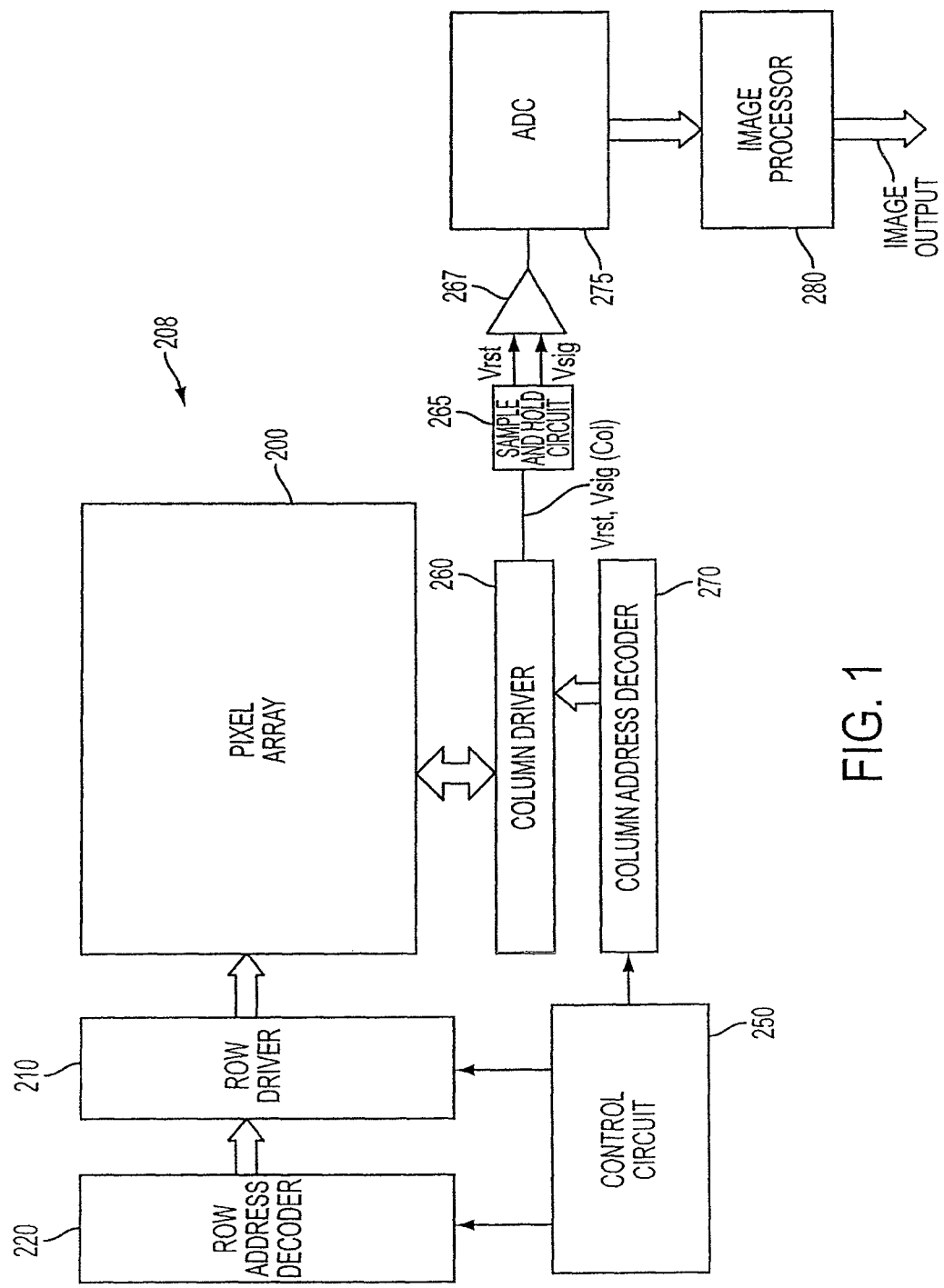
FIG. 1 is a block diagram of a conventional CMOS imager.

In the following detailed description, reference is made to the accompanying drawings, which form a part hereof and illustrate specific embodiments in which the invention may be practiced. In the drawings, like reference numerals describe substantially similar components throughout the several views. These embodiments are described in sufficient detail to enable those skilled in the art to practice the invention, and it is to be understood that other embodiments may be utilized, and that structural, logical and electrical changes may be made without departing from the spirit and scope of the present invention.

The terms "wafer" and "substrate" are to be understood as including silicon, silicon-on-insulator (SOI), or silicon-on-sapphire (SOS) technology, doped and undoped semiconductors, epitaxial layers of silicon supported by a base semiconductor foundation, and other semiconductor structures, as well as insulating substrates, such as quartz or glass. Furthermore, when reference is made to a "wafer" or "substrate" in the following description, previous process steps may have been utilized to form regions or junctions in the base semiconductor structure or foundation. In addition, the semiconductor need not be silicon-based, but could be based on silicon-germanium, germanium, or gallium-arsenide.

The term "pixel" refers to a picture element unit cell containing a photo-conversion device and other devices for converting electromagnetic radiation to an electrical signal. For purposes of illustration, a representative pixel is illustrated in the figures and description herein, and typically fabrication of all pixels in an image sensor will proceed simultaneously in a similar fashion.

Embodiments described herein relate to imager circuits and pixels which employ shutter gate transistors and associated storage regions. Such structures are shown, for example, in co-pending U.S. patent application Ser. Nos. 10/721,190 and 10/721,191, each assigned to Micron Technology, Inc. These patents are incorporated herein by reference.

Figure 3:
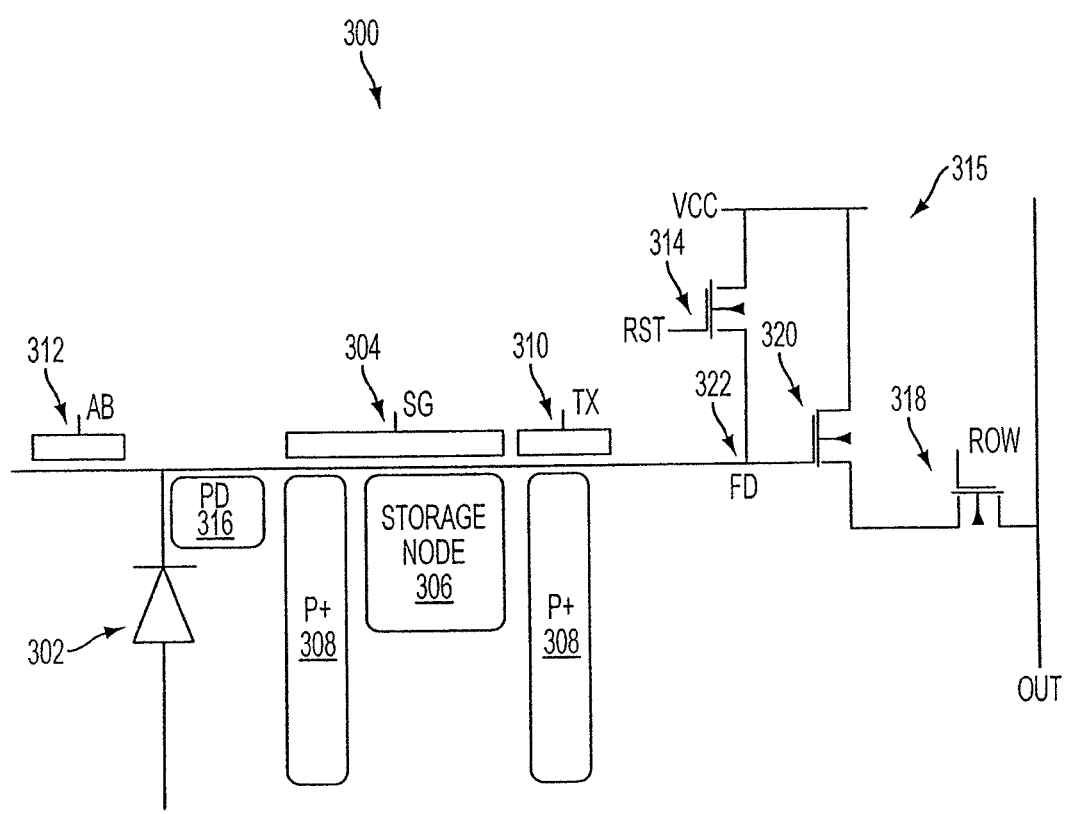
FIG. 3 is a schematic circuit diagram of a storage gate pixel with an anti-blooming gate according to an exemplary of the disclosure.

Referring now to the drawings, where like elements are designated by like reference numerals, FIG. 3 illustrates, partially as a representative semiconductor section and partially as an electrical schematic diagram, a circuit for a pixel 300 of a CMOS imager according to an embodiment. The pixel 300 includes a photosensor, e.g., a photodiode 302, shutter gate transistor 304, storage node 306, doped barrier regions 308, transfer gate transistor 310, anti-blooming transistor 312, floating diffusion node 322, and a reset and readout circuit 315 including reset transistor 314, source follower transistor 320 and row select transistor 318. PD 316 represents the charge capacity of the photodiode 302. The storage node 306 preferably has a charge storage capacity greater than that of the photodiode 302 charge capacity 316.

Figure 4:
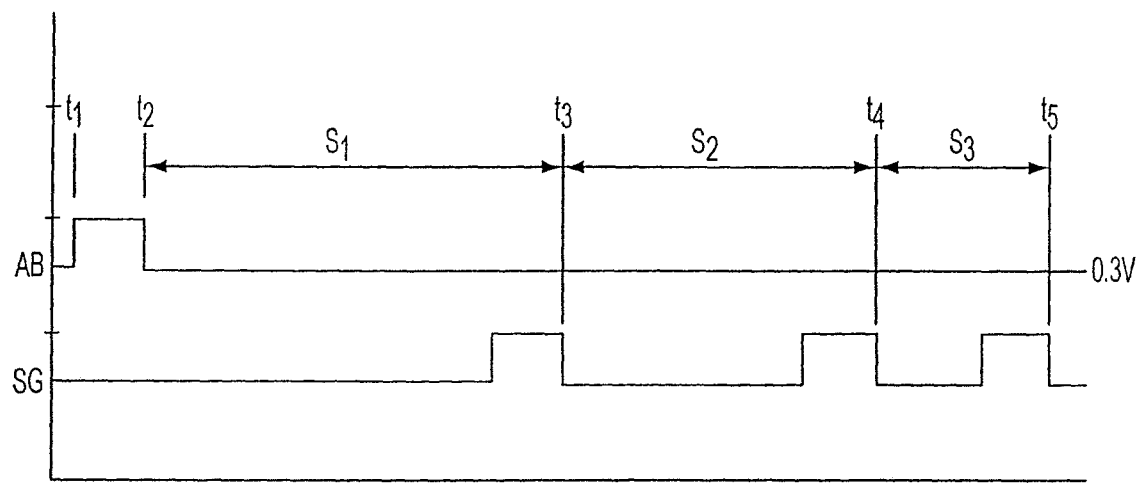
FIG. 4 is an integration period timing diagram in accordance with an embodiment of the disclosure.

FIG. 4 is a diagram showing a timing diagram of an integration period of the pixel 300 (FIG. 3) according to an embodiment. The photodiode 302 is reset by a pulse AB at the anti-blooming transistor gate at t1. Preferably, the AB signal level is dropped to a low positive voltage to operate as an anti-blooming gate at t2. As shown in FIG. 4, AB is held at a constant voltage of about 0.3V for the remainder of the integration period (t2-t5). The photodiode 302 generates charges that are accumulated and transferred to the storage node 306 via the storage gate 304 in multiple transfers. The charges are gathered in a series of sub-integration periods. The number of sub-integration periods may vary. FIG. 4 shows three sub-integration periods, S1, S2, and S3, but more or fewer sub-integration periods may be used. At the end of each sub-integration period, the charge accumulated by the photodiode is transferred to the storage node by respective pulses SG applied to the storage gate. Since the gate voltage on the anti-blooming transistor is constant, the charge capacity 316 of the photodiode 302 remains (Vpin−VAB1)*CPD during the sub-integration periods S1, S2, and S3. Accordingly, the storage node 306 may preferably have a charge storage capacity of at least about twice the charge storage capacity of the photodiode 302, though a lesser storage capacity for the storage node also may be employed.

The lengths of sub-integration periods S1, S2, and S3 are determined by the timing of the SG pulses, and may be equal or different in duration. In the illustrated embodiment, the sub-integration period lengths decrease sequentially as shown in FIG. 4. The sub-integration periods could uniformly be equal or have sequentially increasing lengths.

Figure 5:
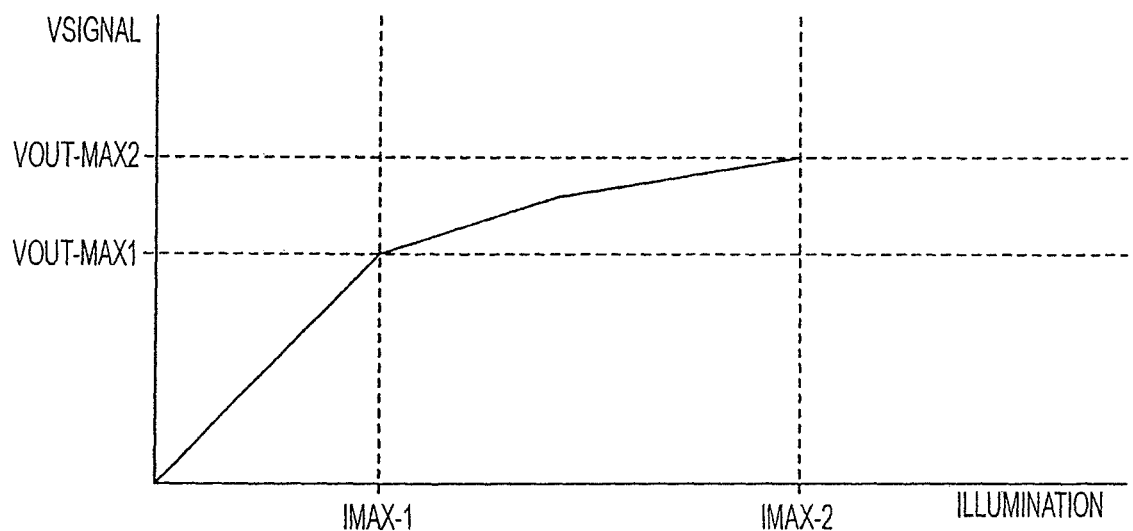
FIG. 5 is an illumination v. voltage graph of a pixel constructed in accordance with an embodiment of the disclosure.

FIG. 5 shows the illumination v. output signal graph resulting from the timing diagram illustrated in FIG. 4. The light dynamic range is increased from Imax−1 to Imax−2. The maximum output signal can be increased from Vout-max1 to Vout-max2 due to storage node 306 having sufficient capacity to store multiple charge transfers from photodiode 302.

As charge is being transferred from photodiode 302 to storage node 306, the floating diffusion node 322 is reset during the same integration frame for a correlated double sampling (CDS) operation. After the floating diffusion node 322 is reset, the reset condition of node 322 is applied to the gate of source follower transistor 320 for a reset readout through row select transistor 318. Once the charge transfers for sub-integration periods S1, S2, and S3 are complete, the charge residing at storage node 306, i.e., the sum of all charges transferred from the photodiode 302 collected during the sub-integration periods S1, S2, and S3, is transferred to the floating diffusion node 322 by the transfer gate 310. From the floating diffusion node 322 the charge is applied to the gate of source follower transistor 320 for readout through row select transistor 318.

Figure 2:
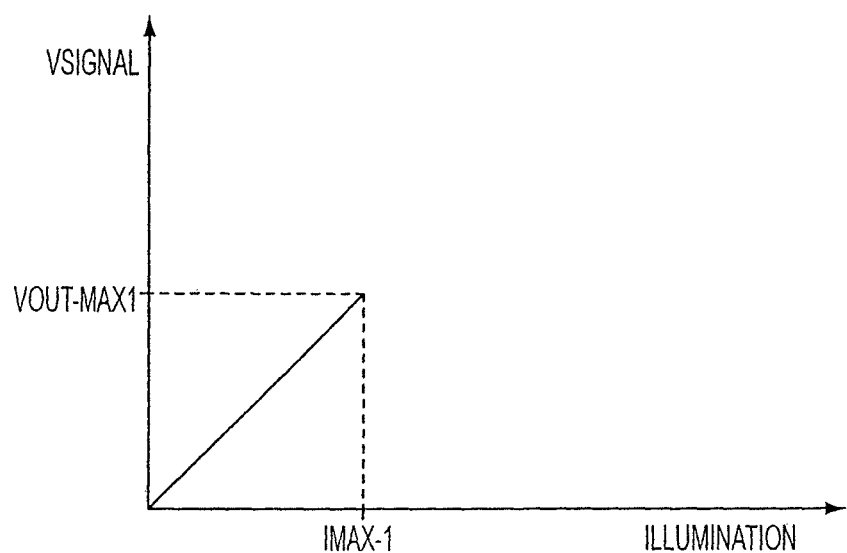
FIG. 2 is an illumination v. voltage graph of a conventional pixel.

The pixel illumination v. output signal graph of FIG. 5 is based on the timing diagram of FIG. 4. The slope of the line representing Vout, corresponds to the length of each sub-integration period. As the sub-integration periods S1, S2, and S3 (in FIG. 4) subsequently shorten, the slope decreases at the respective illumination levels. In one operational embodiment, the varying lengths of sub-integration periods S1, S2, and S3 create angles, or "knees," in the illumination-voltage profile of the device and increase the dynamic range of the pixel, as shown in FIG. 5. Accordingly, the maximum saturation Imax-2 is reached at a greater level of illumination than that of the pixel of prior art, Imax-1, shown in FIG. 2.

Achieving a high dynamic range mode through multiple charge transfers while keeping a constant voltage on the gate of the anti-blooming transistor allows for a reduction in fixed pattern noise at the knee points. As the anti-blooming gate voltage is kept at a known constant for all pixels, deviations attributable to fixed pattern noise can be reliably determined and subtracted out in subsequent pixel signal processing through means known in the art, for example, using a processor which searches a lookup table.

Figure 6:
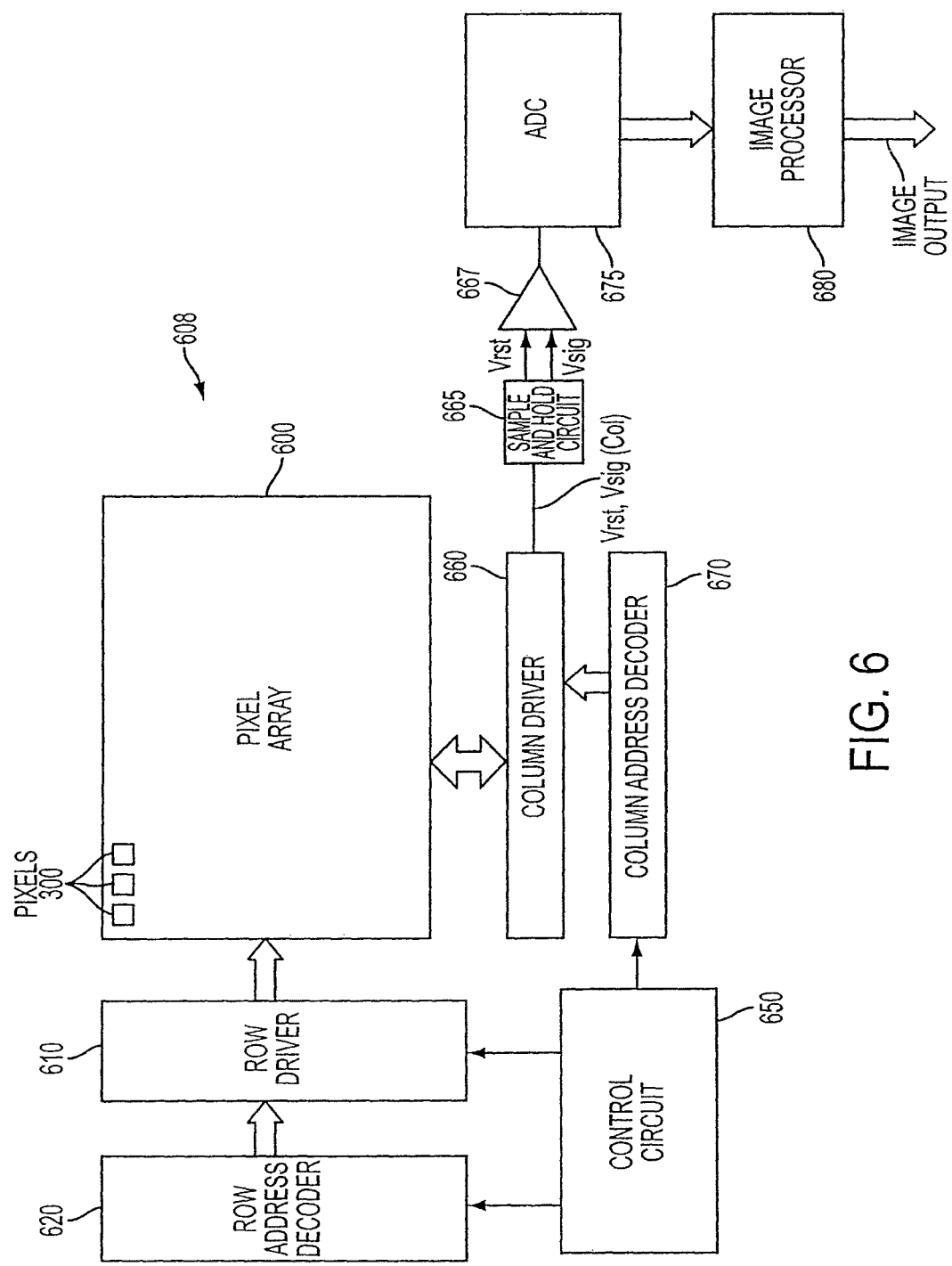
FIG. 6 is a block diagram of a CMOS imager incorporating at least one pixel constructed in accordance with an embodiment of the disclosure.

FIG. 6 illustrates a block diagram of a CMOS imager device 608 including a pixel array 600 having pixels 300 constructed according to one embodiment. The CMOS imager device 608 includes peripheral circuitry including sample and hold circuit 675, amplifier 667, analog to digital converter 675, image processor 680, column and row decoders 670,620, and column and row drivers 670,610, which operates substantially in accordance with the above description of CMOS imager device 208 (FIG. 1). The CMOS imager 608 is operated by the control circuit 650, which controls address decoders 620, 670 for selecting the appropriate row and column lines for pixel readout, row and column driver circuitry 610, 660, which apply driving voltage to the drive transistors of the selected row and column lines, and controls voltage application to pixel transistors (not shown) to achieve desired successive integration periods and charge transfers between storage and floating diffusion nodes. Control circuit 650 may also control application of voltage to the anti-blooming transistors (not shown).

Figure 7:
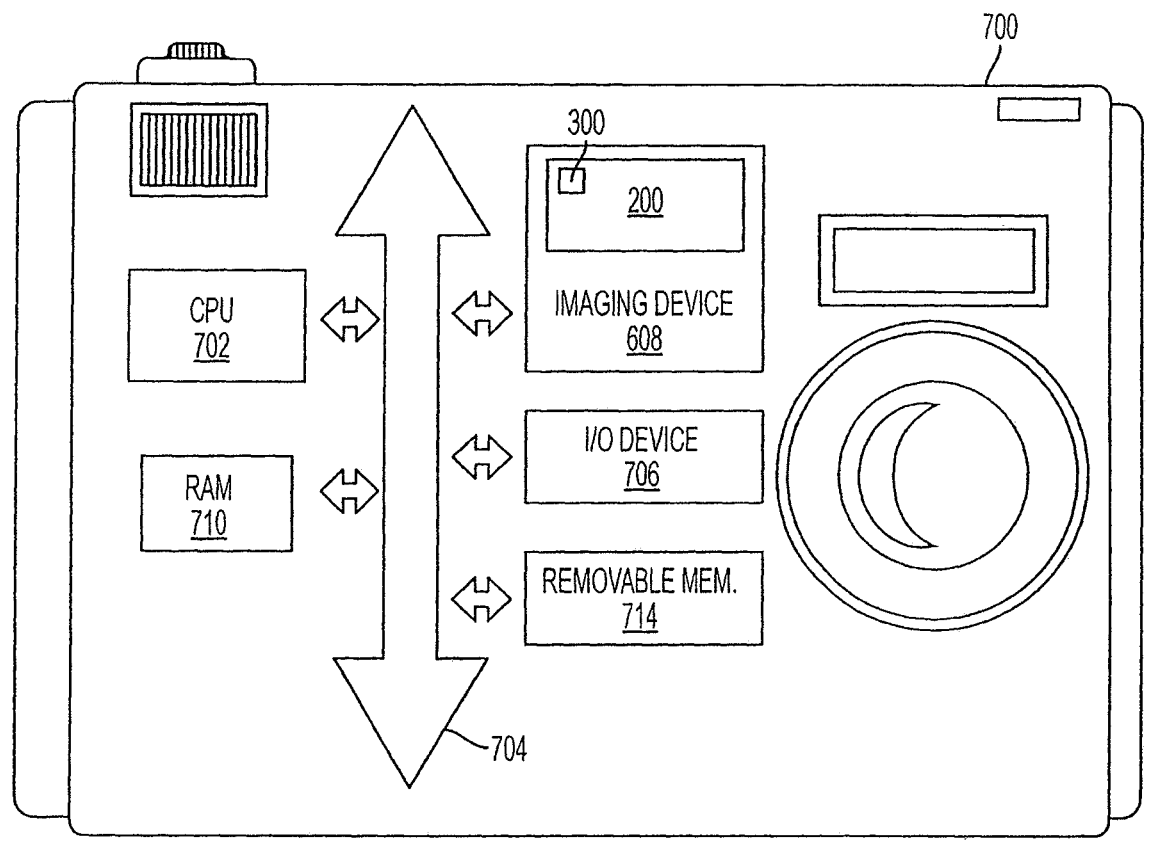
FIG. 7 is a processor system incorporating at least one imager device constructed in accordance with an embodiment of the disclosure.

FIG. 7 shows an image processor system 700, for example, a still or video digital camera system, which includes an imaging device 608 employing pixels 300 constructed in accordance with one embodiment. The imager device 608 may receive control or other data from system 700. System 700 includes a processor 702 having a central processing unit (CPU) that communicates with various devices over a bus 704. Some of the devices connected to the bus 704 provide communication into and out of the system 700; one or more input/output (I/O) devices 706 and imager device 808 are such communication devices. Other devices connected to the bus 704 provide memory, illustratively including a random access memory (RAM) 710, and one or more peripheral memory devices such as a removable memory drive 714. The imager device 608 may be constructed as shown in FIG. 6 with the pixel array 200 having pixels 300. The imager device 608 may, in turn, be coupled to processor 702 for image processing, or other image handling operations. Examples of processor based systems, which may employ the imager device 608, include, without limitation, computer systems, camera systems, scanners, machine vision systems, vehicle navigation systems, video telephones, surveillance systems, auto focus systems, star tracker systems, motion detection systems, image stabilization systems, and others.

It is again noted that the above description and drawings illustrate embodiments that achieve the objects, features, and advantages as may be provided by various embodiments of the present invention. It is not intended that the present invention be limited to the illustrated embodiments. Any modification of the present invention which comes within the spirit and scope of the following claims should be considered part of the present invention. Accordingly, the invention is not limited by the foregoing description or drawings, but is only limited by the scope of the appended claims.

I claim:

1. A pixel circuit, comprising:
a floating diffusion region;
a first photosensor coupled to the floating diffusion region via a first series of transistors;
a first storage region coupled to the first photosensor, the first storage region positioned between a first transistor and a second transistor of the first series of transistors;
a third transistor coupled to the first photosensor and separate from the first series of transistors, wherein the third transistor is configured such that the first photosensor is reset at least when the third transistor is activated while the first transistor is off;
a second photosensor coupled to the floating diffusion region via a second series of transistors different from the first series of transistors; and
a second storage region coupled to the second photosensor, the second storage region positioned between a fourth transistor and a fifth transistor of the second series of transistors, wherein the pixel circuit is configured to pulse a first signal applied to a gate of the third transistor such that (a) the third transistor is activated and the first photosensor is reset and (b) the pulse of the first signal ends before a second signal applied to a gate of the first transistor is asserted.

2. The pixel circuit of claim 1, further comprising a sixth transistor coupled to the second photosensor and separate from the second series of transistors, wherein the sixth transistor is configured such that the second photosensor is reset at least when the sixth transistor is activated while the fourth transistor is off.

3. The pixel circuit of claim 2, wherein the pixel circuit is further configured to pulse a third signal applied to a gate of the sixth transistor such that (a) the sixth transistor is activated and the second photosensor is reset and (b) the pulse of the third signal ends before a fourth signal applied to a gate of the fourth transistor is asserted.

4. The pixel circuit of claim 3, wherein the fourth transistor is directly coupled to the second photosensor.

5. The pixel circuit of claim 3, wherein the fifth transistor is coupled to the second photosensor via the fourth transistor.

6. The pixel circuit of claim 1, wherein the first transistor is directly coupled to the first photosensor.

7. The pixel circuit of claim 1, wherein the second transistor is coupled to the first photosensor via the first transistor.

8. The pixel circuit of claim 1, wherein the first storage region includes a first capacitor.

9. The pixel circuit of claim 8, wherein the second storage region includes a second capacitor.

10. The pixel circuit of claim 1, further comprising a capacitor directly coupled to the floating diffusion region.

11. The pixel circuit of claim 1, further comprising:
a third photosensor coupled to the floating diffusion region via a third series of transistors different from the first and second series of transistors; and a third storage region coupled to the third photosensor, the third storage region positioned between a sixth transistor and a seventh transistor of the third series of transistors.

12. The pixel circuit of claim 11, further comprising an eighth transistor coupled to the third photosensor, wherein the eighth transistor is configured such that the third photosensor is reset when the eighth transistor is activated while the sixth transistor is off.

13. The pixel circuit of claim 12, further comprising:
a fourth photosensor coupled to the floating diffusion region via a fourth series of transistors different from the first, second, and third series of transistors; and
a fourth storage region coupled to the fourth photosensor, the fourth storage region positioned between a ninth transistor and a tenth transistor of the fourth series of transistors.

14. The pixel circuit of claim 13, further comprising an eleventh transistor coupled to the fourth photosensor, wherein the eleventh transistor is configured such that the fourth photosensor is reset when the eleventh transistor is activated while the ninth transistor is off.

15. The pixel circuit of claim 1, wherein:
the floating diffusion region is configured to receive a sum amount of charge from the first photosensor; and
the sum amount of charge is accumulated over multiple sub-integration periods of an integration period.

16. The pixel circuit of claim 1, wherein the pixel circuit is configured to end the pulse of the first signal by dropping the first signal to a constant, non-zero voltage.

17. At least one pixel circuit, comprising:
a floating diffusion node;
at least one photosensor;
a first series of transistors coupling a first photosensor of the at least one photosensor to the floating diffusion node;
a first storage region coupled to the floating diffusion node via at least one transistor of the first series of transistors;
a first transistor coupled to the first photosensor and separate from the first series of transistors, wherein the first transistor is configured such that the first photosensor is reset at least when the first transistor is activated while a transistor of the at least one transistor of the first series of transistors is off;
a second series of transistors different from the first series of transistors; and
a second storage region coupled to the floating diffusion node via at least one transistor of the second series of transistors, wherein the at least one pixel circuit is configured to pulse a first signal applied to a gate of the first transistor such that (a) the first transistor is activated and the first photosensor is reset and (b) the pulse of the first signal ends before a second signal applied to a gate of the transistor of the at least one transistor of the first series of transistors is asserted.

18. The at least one pixel circuit of claim 17, wherein the second series of transistors couples a second photosensor of the at least one photosensor to the floating diffusion node.

19. The at least one pixel circuit of claim 17, wherein the first storage region includes a capacitor.

20. The at least one pixel circuit of claim 17, further comprising a capacitor directly coupled to the floating diffusion node.

21. The at least one pixel circuit of claim 17, wherein the at least one pixel circuit is configured to end the pulse of the first signal by dropping the first signal to a constant, non-zero voltage.

22. The at least one pixel circuit of claim 17, wherein the transistor of the at least one transistor of the first series of transistors is directly coupled to the first photosensor.

23. The at least one pixel circuit of claim 17, wherein:
the transistor of the at least one transistor of the first series of transistors is configured as a shutter gate transistor; and
the first transistor is configured as an anti-blooming transistor.

24. The at least one pixel circuit of claim 17, wherein:
the first photosensor is configured to generate a sum amount of charge during an integration period;
the sum amount of charge is accumulated over multiple sub-integration periods of the integration period;
the sum amount of charge includes a plurality of portions;
one or more portions of the plurality of portions are transferred from the first photosensor to the first storage region during the integration period; and
the floating diffusion node is configured to receive the sum amount of charge from the first photosensor.

25. An imager circuit, comprising:
at least one pixel circuit including a floating diffusion region, a first photosensor coupled to the floating diffusion region via a first series of transistors, a first storage region coupled to the first photosensor, wherein the first storage region is positioned between a first transistor and a second transistor of the first series of transistors, and wherein the first transistor is directly coupled to the first photosensor, a third transistor directly coupled to the first photosensor and separate from the first series of transistors,
a second photosensor different from the first photosensor and coupled to the floating diffusion region via a second series of transistors different from the first series of transistors,
a second storage region coupled to the second photosensor, the second storage region positioned between a fourth transistor and a fifth transistor of the second series of transistors; and
a control circuit configured to pulse a first signal applied to a gate of the third transistor such that (a) the third transistor is activated, (b) the first photosensor is reset, and (c) the pulse of the first signal ends before a second signal applied to a gate of the first transistor is asserted to activate the first transistor.

26. The imager circuit of claim 25, wherein the first storage region includes a capacitor.

27. The imager circuit of claim 25, further comprising a capacitor directly coupled to the floating diffusion region.

28. The imager circuit of claim 25, wherein, to end the pulse of the first signal, the control circuit is configured to drop the first signal to a constant, low-positive voltage for a duration of an integration period.

29. The imager circuit of claim 25, wherein the first transistor is directly coupled to the third transistor.

30. The imager circuit of claim 25, wherein:
the floating diffusion region is configured to receive a sum amount of charge from the first photosensor; and
the sum amount of charge is accumulated over multiple sub-integration periods of an integration period.

* * * * *